United States Patent [19]
Kudou

[11] Patent Number: 5,130,941
[45] Date of Patent: Jul. 14, 1992

[54] DYNAMIC BARREL SHIFTER

[75] Inventor: Tsuneaki Kudou, Yokohama, Japan

[73] Assignee: Kabushiki Kaisha Toshiba, Kawasaki, Japan

[21] Appl. No.: 622,969

[22] Filed: Dec. 6, 1990

[30] Foreign Application Priority Data

Feb. 7, 1990 [JP] Japan .................. 2-026153

[51] Int. Cl.$^5$ ................................ G06F 7/38
[52] U.S. Cl. .................................. 364/715.08
[58] Field of Search ............... 364/715.08, 715.01

[56] References Cited

U.S. PATENT DOCUMENTS

| | | | |
|---|---|---|---|
| 4,653,019 | 3/1987 | Hodge et al. | 364/900 |
| 4,831,571 | 5/1989 | Tokumaru | 364/715.08 |
| 4,839,839 | 6/1989 | Tokumaru | 364/715.08 |
| 4,839,840 | 6/1989 | Tokumaru | 364/715.08 |
| 4,962,511 | 10/1990 | Tokumaru | 377/69 |
| 4,999,796 | 3/1991 | Dewitt et al. | 364/715.08 |
| 5,024,993 | 6/1991 | Kroger et al. | 364/715.08 |

FOREIGN PATENT DOCUMENTS 3513473 10/1985 Fed. Rep. of Germany.
WO88/00738 1/1988 PCT Int'l Appl.

*Primary Examiner*—Long T. Nguyen
*Attorney, Agent, or Firm*—Foley & Lardner

[57] ABSTRACT

A dynamic barrel shifter has a data input portion, a data shift portion, and a shifted data output portion including sense inverters which are set at threshold voltage higher than a half of the power source voltage. The sense inverters are provided for every transmission route for each binary code. The dynamic barrel shifter also has a pre-charge portion for pre-charging the data shift portion and the shifted data output portion prior to the input of data. The pre-charge portion includes a first power source voltage applying circuit for applying electric potential lower than the power source voltage to the data shift portion through first gate elements from the power source, and a second power source voltage applying circuit for applying electric potential equal to the power source voltage to the input side of the shifted data output portion through second gate elements.

4 Claims, 5 Drawing Sheets

DYNAMIC BARREL SHIFTER

BACKGROUND OF THE INVENTION

1. Field of the Invention

The present invention relates to a dynamic barrel shifter of a pre-charge method, and particularly to a dynamic barrel shifter of low power consumption capable of high speed operation.

2. Description of the Background Art

A dynamic barrel shifter which can receive data in parallel, freely shift the data in a predetermined direction by a predetermined number of bits, and output it in parallel has been employed in a high level microprocessor.

FIG. 1 shows an example of construction of a conventional four-bit dynamic barrel shifter.

As shown in the drawing, the four-bit dynamic barrel shifter 1 includes clocked inverters 2a to 2d for receiving binary codes D0 to D3 forming four-bit data, a first selector portion 3 for selecting whether the data is shifted by two bits to the left direction defined at the drawing after the data is inverted and driven by the clocked inverters 2a to 2d and outputted in parallel, a pre-charge circuit 4 for carrying out pre-charge synchronized with a clock signal to nodes N1 to N6 located on the output side of the selector 3, a second selector portion 5 for selecting whether the data transmitted through the above data transmission routes is shifted by one bit to the left direction defined at the drawing, and output inverters 6a to 6h for inverting and driving shifted data provided from the selector portion 5 to output them in parallel.

In the same drawing, when the clock signal is at the L level, the clocked inverters 2a to 2d respectively output binary codes as receive data into the first selector portion 3 under control of the clock signal inverted to the H level through an inverter 7.

The first selector portion 3 includes N channel MOS type FET transistors (hereinafter called Nch) 8a to 8f for receiving a shift control signal S1 at each gate thereof, and other Nch 10a to 10f for receiving a signal obtained by inversion of the shift control signal S1, through an inverter 9, at each gate thereof. When the signal to be provided to each gate of the Nch is at the H level, each course between the source and the drain becomes conductible.

Moreover, the second selector portion 5 comprises Nch 11a to 11g for receiving a shift control signal S2 at each gate thereof, and other Nch 13a to 13g for receiving a signal obtained by inversion of the shift control signal S2, through an inverter 12, at each gate thereof. Similarly to the first selector portion 3, when the signal provided to each gate of the Nch is at the H level, each course between the source and the drain becomes conductible.

The pre-charge circuit 4 comprises Nch 14a to 14f for carrying out charge to the nodes N1 to N6 at a fixed positive voltage level. The Nch 14a to 14f are positioned between a power source VDD and the nodes N1 to N6.

In the above-mentioned construction, when the clock signal is at the H level as shown in FIG. 2 (time t0), since the clocked inverters 2a to 2d are controlled by the clock signal inverted at the L level through the inverter 7, data can not be received into the dynamic barrel shifter 1. In such a state, positive voltage is applied to the nodes N1 to N6 for a predetermined pre-charge period (t3−t0), at a fixed level lower than the potential of the power source voltage, by the pre-charge circuit 4, and lines on which data transmit (hereinafter called data transmission routes) provided in the first selector portion 3 and the second selector portion 5 are set at the H level (positive potential) initially. In this case, output codes OUT0 to OUT7 are inverted by the output inverters 6a to 6h, and set at the L level (zero potential).

During the pre-charging time, the potential of the input data is set (time t1), and the shift control signals S1, S2 are independently set at the H level or L level (time t2), then preparation for shifting the input data by a predetermined number of bits is carried out.

Next, when the clock signal is changed into the L level (time t3), the binary codes D0 to D3 are respectively inverted and received through the clocked inverters 2a to 2d in parallel under control of the clock signal inverted at the H level by the inverter 7.

Then, data composed of the binary codes D0 to D3 are respectively transmitted through the Nch 8c to 8f because the respective Nch 8a to 8f become conductible when the shift control signal S1 is at the H level in the first selector portion 3. Namely, the data is shifted by two bits in the left direction defined by the drawing.

When the signal S1 is at the L level, since the signal S1 is inverted into the H level by the inverter 9, the Nch 10a and 10f are in conduction, so that the data is transmitted through the Nch 10a and 10f. The data is not shifted in this case.

Then, the data is provided to the second selector portion 5, where it is selected whether the data is shifted or not. When the shift control signal S2 is at the H level, the data is transmitted through the Nch 11a to 11g. Thus, the data is shifted by one bit to the left direction in the drawing.

On the other hand, when the signal is at the L level, since the signal S2 is inverted to the H level by the inverter 12, the data is transmitted through the Nch 13a to 13g conductible. Namely, the data is not shifted.

Then, the data is transmitted through the second selector 5. Thereafter, the binary codes D0 to D3 composing the data are respectively driven by the output inverters 6a to 6g to output as the output codes OUT0 to OUT7 (time t4).

FIG. 3 shows the result of the shift of the data.

As shown in FIG. 3, when the output codes OUT0 to OUT7 corresponding to the binary codes D0 to D3 for forming the input data composed of four bits are detected, these codes are divided into an output portion I of four bits for outputting the output codes from OUT0 to OUT3 and another output portion II of four bits for outputting the output codes from OUT4 to OUT7.

By detecting these output codes by dividing them into the output portion I and the output portion II, a data shifted in the left direction is designated by the output portion I, and the shifted bit number is changed between 0 and 3. While a data shifted in the right direction is designated by the output portion II, and the shifted bit number is changed between 1 and 4.

In other words, the four-bit dynamic barrel shifter 1 can freely carry out all kinds of data shifts by controlling the shift control signals S1 and S2 to the data composed of four bits.

Next, the electric potential change of data transmission routes in the operation mode of the dynamic barrel shifter 1 is explained.

When the clocked inverters 2a to 2d are conductible and the input codes are at the H level, the input codes are respectively inverted to the L level by the clocked inverters 2a to 2d. By the inversion into the L level, all the electric power pre-charged at the transmission routes of input codes and the input sides of output inverters 6a to 6g connected to the transmission routes is discharged. Then, by the discharge, when the potential level of the data transmission routes pre-charged at a predetermined positive level in advance is decreased to a value lower than the threshold voltage (generally, a half of the power source voltage VDD) of the output inverters 6a to 6g, the output inverters 6a to 6g respectively judge that the binary codes to be transmitted are at the L level, then change the level of the output codes into the H level. The time required for shifting the input codes of the H level and outputting them is the time required for the discharge in which the potential level of the input codes is decreased from the H level to a level lower than the threshold voltage.

On the other hand, when the input codes at the L level (zero potential), the input codes are inverted at the H level (positive potential) by the clocked inverters 2a to 2d. In this case, the electric power pre-charged in advance at the transmission routes of the input codes is maintained as it is, so that the positive potential on the input sides of the respective output inverters is not changed. Since the potential level of the output codes are kept at the L level, the time required for shifting the input codes of the L level is substantially zero.

Accordingly, in such a dynamic barrel shifter for carrying out pre-charge to the data transmission routes, since the time required for processing input codes of the L level is substantially zero, the data process can be carried out far more rapidly than that in barrel shifters where the pre-charge is not carried out.

Moreover, in the dynamic barrel shifter 1 shown in FIG. 1, since the positive pre-charge voltage obtained by utilizing the back gate effect of Nch can be controlled at a value of VDD−Vth (Vth is a voltage value of about 1.7V corresponding to voltage drop by the back gate effect) lower than the power source voltage VDD (set at 5V in this case), as compared with a case where the pre-charge voltage is controlled at the same potential with the power source voltage VDD, the time required for discharge in which the pre-charge voltage is decreased to a value lower than the threshold voltage (½ VDD) can be shortened. Namely, since the time required for processing input codes of the H level can be shortened, the data process can be carried out much more rapidly.

However, in the dynamic barrel shifter mentioned above, since the difference between the potential level VDD−Vth of the binary codes of the H level and the threshold voltage (½ VDD) of the output inverters 6a to 6h is small, an operation margin of the output inverters 6a to 6h is so narrow that wrong operation is likely to be caused by charge share, noises and coupling.

To improve this, a method in which a transfer gate composed of a group of the Nch of the second selector portion 5, for example the Nch 11a and 13a as shown in FIG. 4a, is replaced with a pass transistor as shown in FIG. 4b.

Namely, the pass transistor is composed of a circuit in which a parallel circuit provided with the Nch 11a and a P channel MOS type FET transistor (hereinafter, called Pch) and another parallel circuit provided with the Nch 13a and a Pch are connected in parallel.

In the method using such a pass transistor, since the back gate effect on the Nch can be eliminated by the Pch, the electric potential of binary codes of the H level to be transmitted to the output inverters 6a to 6h from the second selector portion 5 becomes equal to the power source voltage VDD, so that a satisfactory operation margin can be obtained.

However, in the pass transistor method, the number of transistors included in the second selector portion 5 is increased twice, thus the size of the dynamic barrel shifter must be large.

Therefore, there is also considered another method in which the group of Nch included in the second selector 5 are all exchanged for a group of the Pch so as to eliminate of the back gate effect.

However, since charge and discharge ability of the Pch is inferior to that of the Nch, the operation time is increased. Moreover, the difference between the electric potential of the binary codes at the H level to be transmitted to the output inverters 6a to 6h, that is, the power source voltage VDD and the threshold voltage (½ VDD) of the output inverters 6a to 6h becomes large, so that the time required for discharging the potential of the data transmission routes to the threshold voltage is inevitably elongated. This means that the time required for processing the input codes at the H level increases.

SUMMARY OF THE INVENTION

The present invention was made to solve the above problems of the prior art. Therefore it is an object to provide a dynamic barrel shifter which can realize such high speed operation as in the conventional dynamic barrel shifters, without causing wrong operation by charge share, noises and coupling, in a suitable size and small power consumption.

To achieve the object, the dynamic barrel shifter of the present invention, comprises:
(a) a data input portion for receiving data composed of a group of binary codes in parallel,
(b) a data shift portion for shifting data received from the input portion by a predetermined number of bits, and
(c) a shifted data output portion for outputting data shifted by the data shift portion in parallel, the shifted data output portion including
(1) sense inverters set at a threshold voltage higher than a half of the power source voltage and provided for every transmission route for each binary code composing the shifted data; and
(d) a pre-charge portion for pre-charging the data shift portion and the shifted data output portion prior to the input of data, the pre-charge portion including:
(1) a first power source voltage applying circuit for applying electric potential lower than the power source voltage to the data shift portion through first gate elements from the power source, and
(2) a second power source voltage applying circuit for applying electric potential equal to the power source voltage to the input side of the shifted data output portion through second gate elements from the power source.

In the above construction, it is preferred that the first gate elements of the first power source voltage applying circuit are N channel transistors presenting the back gate effect, while the second gate elements of the second power source voltage applying circuit are P channel transistors not presenting the back gate effect.

Moreover, it is also preferred that each of the sense inverters be composed of a P channel transistor whose source is set at the power source potential, and an N channel transistor whose drain is set at the zero potential. A capacity of conductivity of the N channel transistor is smaller than that of the P channel transistor, and the drain of the P channel transistor and the source of the N channel transistor are connected to each other to form an output node, and the binary codes are provided to the gate of the P channel transistor and the gate of the N channel transistor, respectively, to obtain output codes from the output node.

It is still preferred that each of the sense inverters is composed of a group of N channel transistors in which the drains and the sources are successively connected in series, and the drain end of the group is set at the zero potential, and a P channel transistor whose source is set at the power source potential. A capacity of conductivity of the group of N channel transistors is smaller than that of the P channel transistor, and the drain of the P channel transistor and the source end of the group of N channel transistors are connected to each other to form an output node, and the binary codes are provided to the gate of the P channel transistor and the gates of the group of N channel transistors respectively to obtain output codes from the output node.

In the dynamic barrel shifter, prior to the input of data, the first power source voltage applying circuit composed of the first gate elements (for example, N channel transistors) presenting the back gate effect applies electric potential lower than the power source voltage (for example positive voltage) to the data shift portion so as to initially set the portion at the H level (positive potential). While the second power source voltage applying circuit composed of the second gate elements (for example, P channel transistors) not presenting the back gate effect applies electric potential equal to the power source voltage to the input side of the shifted data output portion so as to initially set the portion at the H level (positive potential).

At the time, the shifted data output portion outputs binary codes whose potential level is inverted from the H level to the L level (zero potential) by the sense inverters.

Then, data received in parallel are transmitted in the data shift portion to be shifted by a predetermined number of bits.

In this case, when the binary codes forming the data to be shifted in the data shift portion are at the H level, the electric potential of the input side of the shifted data output portion is kept at the positive potential equal to the power source voltage. Accordingly, since the binary codes transmitted through the above-mentioned routes have the positive potential equal to the power source voltage respectively, the sense inverters of the shifted data output portion continue to output the L level without switching the potential levels.

The time required for the shift process of the binary codes is substantially zero.

When the binary codes forming the data to be shifted are at the L level, the positive potential equal to the power source voltage on the input side of the shifted data output portion is lowered by discharge. Then, when the electric potential on the input side reaches a value lower than the threshold voltage of the sense inverters in the shifted data output portion, the sense inverters judge that the binary codes to be transmitted are at the L level, then carry out the level switching operation, thereafter output the H level.

The time required for the shift process of the binary codes is equal to the time required for the discharge in which the positive potential equal to the power source voltage on the input side of the shifted data output portion is decreased to a value lower than the threshold voltage of the sense inverters.

Accordingly, since the data shift portion is charged at electric potential lower than the power source voltage by utilizing the back gate effect, the power consumption can be reduced as compared with the case charged at electric potential equal to the power source voltage.

Since the input side of the shifted data output portion is charged at an electric potential equal to the power source voltage without being subjected to influence of the back gate effect, it becomes possible to obtain a satisfactory operation margin of the shifted data output portion. When the threshold voltage of the sense inverters is set at a value higher than a half of the power source voltage on condition that the operation margin can be sufficiently assured, the discharge time can be maintained so long as in the prior art.

Moreover, since the positive potential equal to the power source is charged only at the input side of the shifted data output portion, the increase of power consumption caused by the discharge can be controlled to the minimum value.

BRIEF DESCRIPTION OF THE DRAWINGS

FIGS. 1 to 4 show the prior art, in which FIG. 1 shows construction of a hardware, FIG. 2 is a timing chart to show operation of dynamic barrel shifters shown in FIGS. 1 and 5, FIG. 3 is an explanatory diagram of results of shifted input codes in the dynamic barrel shifters shown in FIGS. 1 and 5, FIG. 4a shows the construction of a transfer gate of an Nch used for the dynamic barrel shifter shown in FIG. 1, FIG. 4b is a diagram showing a pass transistor used in a case where the data shift portion and the shifted data output portion are pre-charged up to the power source voltage.

DESCRIPTION OF THE SPECIFIC EMBODIMENTS

Hereinafter, preferred embodiments of the present invention will be explained with reference to the drawings.

Figure 5:
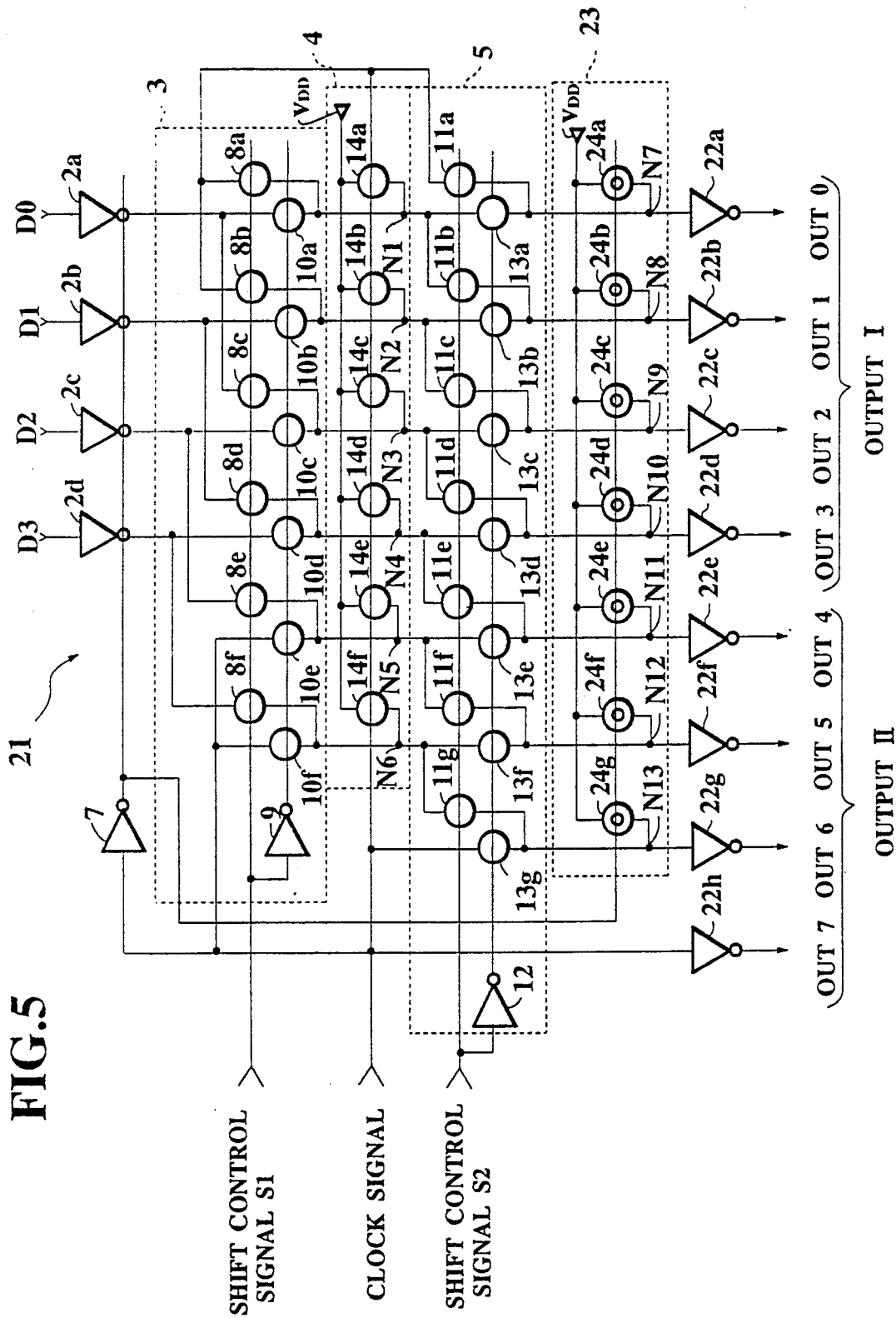
FIG. 5 is a constructional diagram of a hardware of a dynamic barrel shifter related to a first embodiment of the present invention.

FIG. 5 is a constructional diagram of a hardware of a dynamic barrel shifter related to a first embodiment of the present invention.

Figure 1:
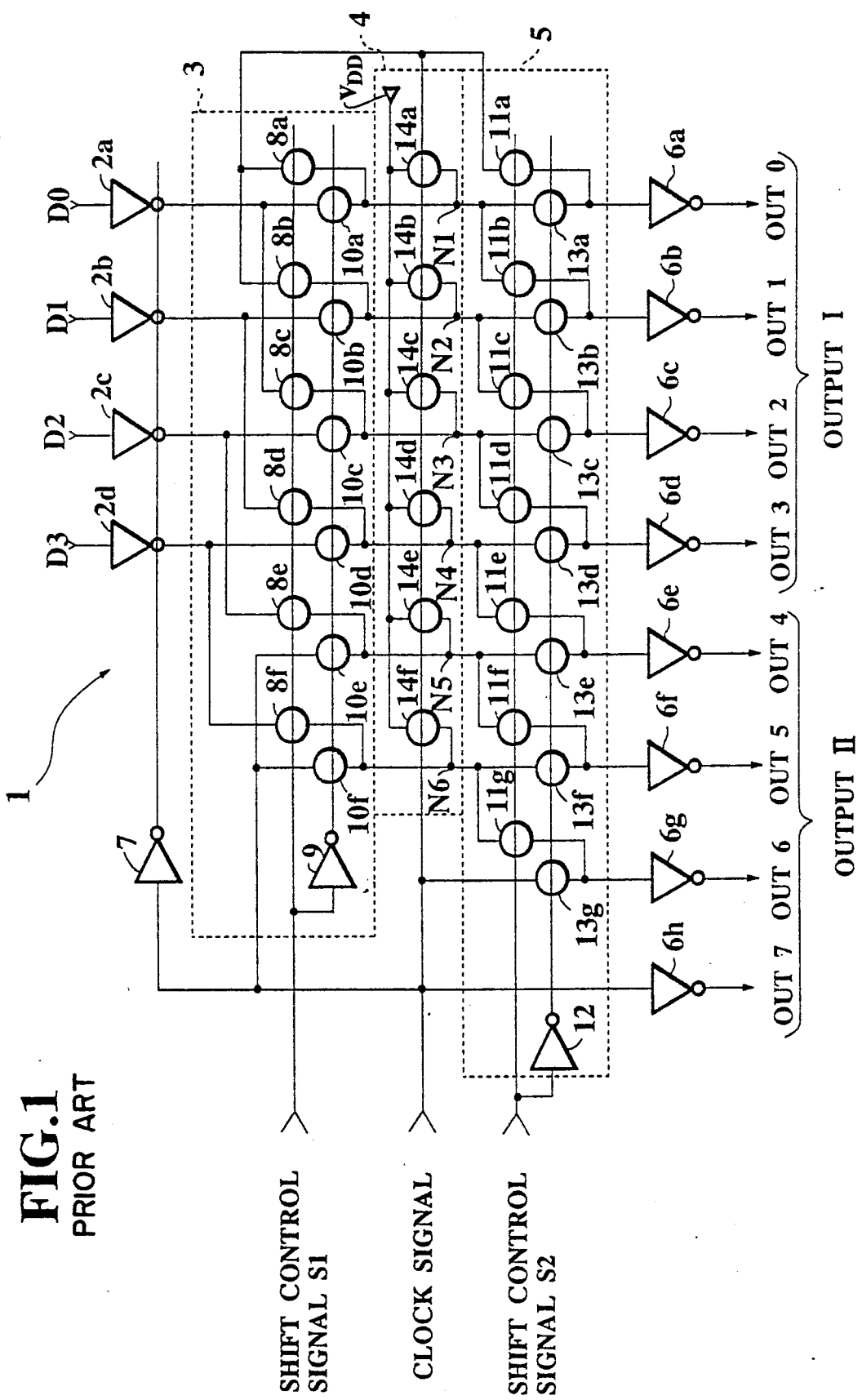

As shown in the FIG. 5, a dynamic barrel shifter 21 of the present invention, similarly to the four-bit dynamic barrel shifter shown in FIG. 1, comprises clocked inverters 2a to 2d, Nch 8a to 8f and Nch 10a to 10f in a first selector portion 3, Nch 14a to 14f in a pre-charge circuit 4, Nch 11a to 11g and Nch 13a to 13g in a second selector portion 5 and inverters 7, 9 and 12. Moreover, in the first embodiment, sense inverters 22a to 22h and a Pch pre-charge circuit 23 for carrying out pre-charge synchronized with a clock signal on the input side of the inverters 22a to 22h are provided in place of the output inverters 6a to 6h shown in FIG. 1.

In such construction, a data input portion is composed of the clocked inverters 2a to 2d, and a data shift portion is composed of the first selector portion 3 and the second selector portion 5. Moreover, a shifted data output portion is composed of the sense inverters 22a to 22h and the Pch pre-charge circuit 23.

The Pch pre-charge circuit 23 applies power source voltage VDD to nodes N7 to N13 through Pch 24a to 24g respectively provided between the power source VDD and the nodes N7 to N13.

Figure 6:
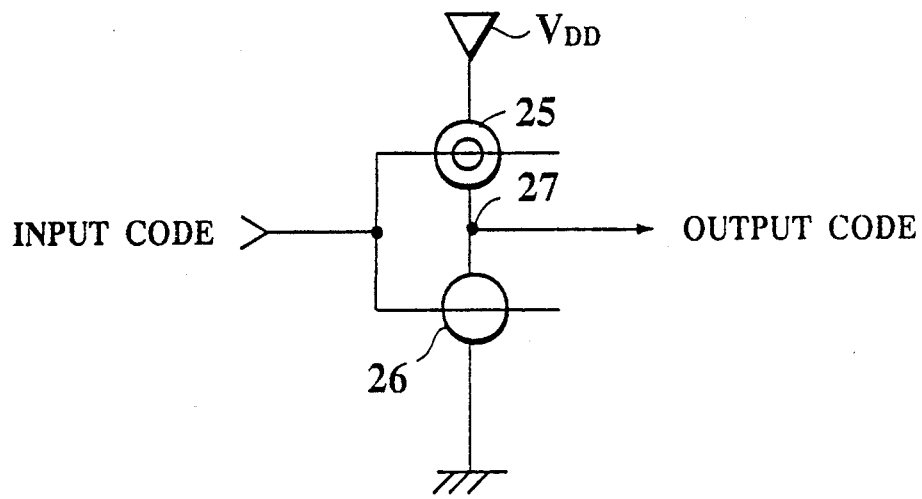
FIG. 6 is a circuit diagram of a sense inverter used for the dynamic barrel shifter shown in FIG. 5.

Moreover, as shown in a circuit diagram in FIG. 6, each of the sense inverters 22a to 22h is composed of a Pch 25 whose source is connected to the power source VDD and an Nch 26 whose drain is grounded. A capacity of conductivity of the Nch 26 is smaller than that of the Pch 25. Furthermore, the drain of the Pch 25 and the source of the Nch 26 are connected to each other to form an output node 27 so that binary codes are respectively provided to the gate of the Pch 25 and the gate of the Nch 26 to obtain output codes from the output node 27. When the electric potential of input codes is set at a value higher than a boundary potential between the H and the L level, that is, a half of the power source potential VDD, the internal resistance of the Pch 25 becomes substantially equal to the internal resistance of the Nch 26, so that the electric potential of the output node 27 becomes a half of the power source potential VDD. In other words, the threshold voltage of the sense inverters 22a to 22h is set at a value higher than a half of the power source voltage VDD.

In the above construction of the dynamic barrel shifter 21, when the clock signal is at the H level, the Pch pre-charge circuit 23 pre-charges a positive potential equal to the power source voltage to the input side of the sense inverters 22a to 22h. In this case pre-charging timing of the circuit 23 is synchronized with the clock signal inverted at the L level by the inverter 7.

The input side of the sense inverters 22a to 22h is initially set at the H level, and output codes OUT0 to OUT6 are inverted by the sense inverters 22a to 22h to be set at the L level.

Similarly to the four-bit dynamic barrel shifter 1, the pre-charge circuit 4 pre-charges to the first selector portion 3 and the second selector portion 5 at a positive potential lower than the power source voltage to set them at the H level initially.

Figures 2, 3:
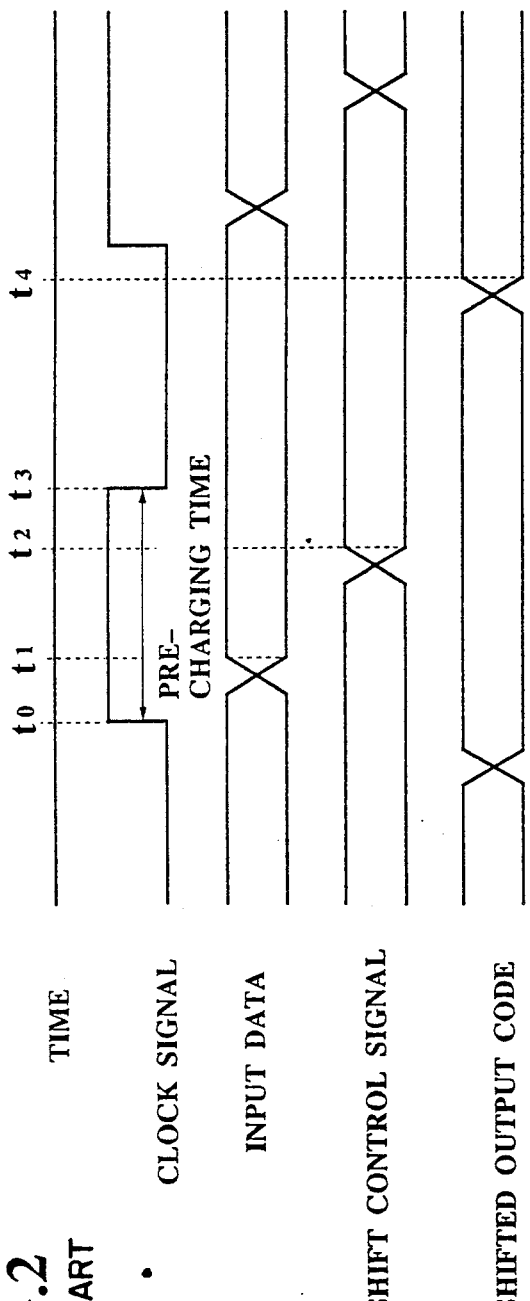
Figure 4:
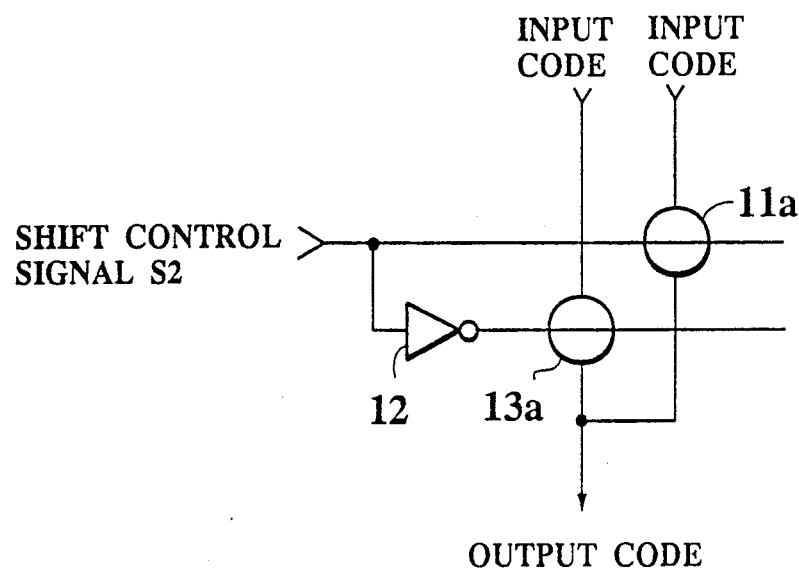
Figure 4:
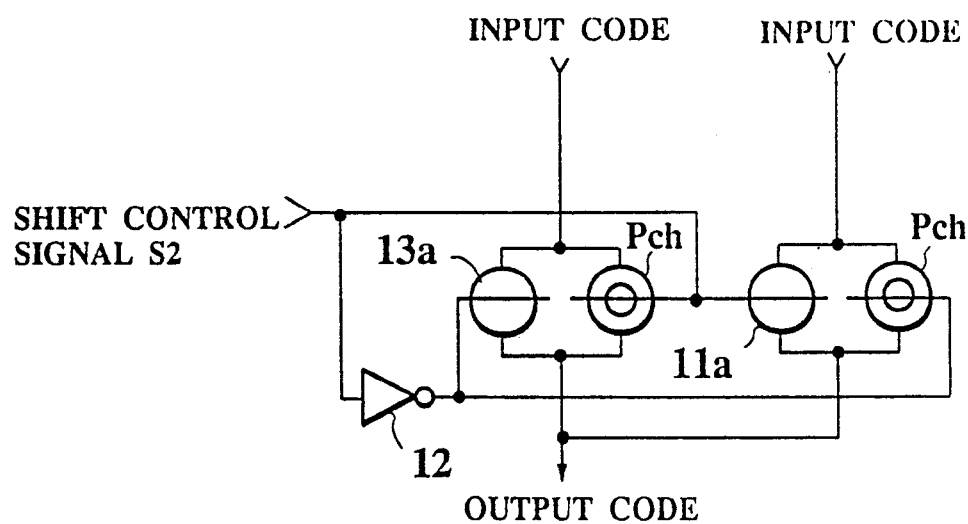

Then, input data composed of binary codes D0 to D3 are respectively shifted by the first selector portion 3 and the second selector portion 5 in accordance with the timing chart shown in FIG. 2 in the same manner with the prior art, so that results of data shift similar to those in the conventional example shown in FIG. 3 can be obtained.

In this case, when the binary codes composing the shifted data as mentioned above are at the H level (that is, when the input codes are at the L level), electric charge respectively pre-charged to the first selector portion 3 and the second selector portion 5 is maintained and the positive potential on the input side of the sense inverters for outputting binary codes is not changed.

Namely, the output codes are kept at the L level, so that the time required for processing the binary codes is substantially zero.

On the other hand, when the binary codes for composing the shifted data are at the L level (that is, when the input codes are at the H level), the first selector portion 3 and the second selector portion 5 respectively pre-charged with electric charge up to the potential equal to the power source voltage discharge the charge. In particular, when the electric potential of the second selector 5 is decreased to a value lower than the threshold voltage of the sense inverters 22a to 22h, the sense inverters 22a to 22h for outputting the binary codes judge that the binary codes to be transmitted are at the L level, and switch the potential level of the output codes into the H level.

Namely, the time required for the discharge which decreases the potential equal to the power source voltage to the threshold voltage of the sense inverters 22a to 22h corresponds to the time required for processing the binary codes composing the data.

Accordingly, by the dynamic barrel shifter according to the present invention, since the input side of the sense inverters 22a to 22h is pre-charged up to the positive potential equal to the power source voltage by using the Pch not generating the back gate effect, a satisfactory operation margin concerning the threshold voltage of the sense inverters 22a to 22h can be obtained, and wrong operation caused by charge share, noises and coupling can be prevented.

Moreover, by adjusting the capacity of the Pch 26 in the range where the operation margin can be sufficiently assured and setting the threshold voltage of the sense inverters 22a to 22h at a suitable electric potential higher than a half of the power source voltage, the discharge time can be kept as long as in the prior art. Namely, high-speed operation with respect to the input codes of the H level can be realized.

Moreover, since a region to be pre-charged up to the positive potential equal to the power source voltage is limited to the input side of the sense inverters 22a to 22h by using the Pch 24a to 24g, the power consumption required for the discharge can be minimized.

Since only the Pch 24a to 24g are newly provided on the input side of the sense inverters 22a to 22h without replacing the transfer gates with the pass transistors in the second select portion 5, the increase of size required for the improvement is also minimized.

Furthermore, since the discharge is carried out in a relatively high potential on the input side of the sense inverters 22a to 22h as compared with the prior art, the discharge speed can be elevated. Even if the operation margin is the same with the prior art, the process speed of data is higher than that thereof.

In the dynamic barrel shifter described herein, it is possible to use a suitable switching circuit in place of the Pch pre-charge circuit 23.

Figure 7:
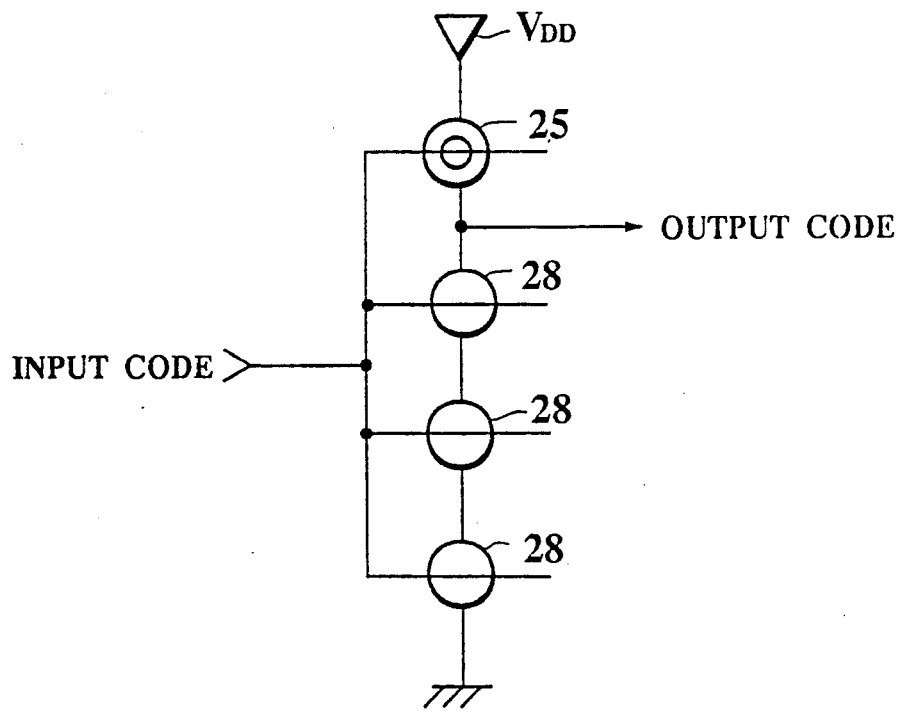
FIG. 7 is a circuit diagram of another embodiment of the sense inverter of the dynamic barrel shifter shown in FIG. 5.

Moreover, to increase the internal resistance by substantially elongating the channel length, it is possible to use a group of Nch 28 which can be obtained by connecting the sources with the drains thereof in series as shown in FIG. 7 in place of the sense inverter Nch 26 shown in FIG. 6.

Furthermore, the pre-charge is carried out on the positive potential side in the embodiment, but the discharge on the negative potential side is also possible. In this case, the input codes at the H level are assigned to the zero potential, while the input codes at the L level are assigned to a negative potential. Accordingly, when the codes of the L level are received at the dynamic barrel shifter, its data transmission routes are charged.

It should be understood that the present invention is not limited to the embodiments mentioned above, and suitable design alterations and suitable modifications can be applied thereto.

What is claimed is:

1. A dynamic barrel shifter for shifting input data with binary codes transmitted through a plurality of N channel transistors connected by first-data-transmission routes, comprising:

first pre-charging means for pre-charging the first-data-transmission routes to a preset high level with a first electric potential of less than a supply electric potential, through an N channel transistor before shifting the input data;

second pre-charging means for pre-charging second-data-transmission routes which follow the first-data-transmission routes to the supply electric potential, through a P channel transistor before shifting the input data, the second-data-transmission routes thereby being preset at the high level;

input data shifting means for shifting the input data by a shift count in response to shift control signals by discharging the first-data-transmission routes and the second-data-transmission routes in cases where the input data is at a low level and by maintaining the charges of both the first-data-transmission routes and the second-data-transmission routes in cases where the input data is at the high level; and input data output means with sense inverters for outputting the input data shifted by the input data shifting means after inverting the shifted input data at the high level in the sense inverters when the supply electric potential of the second-data-transmission routes is decreased to a value lower than that of a threshold voltage of the sense inverter, the threshold voltage being higher than half of the supply electric potential, and after inverting the shifted input data at the low level in the sense inverters when the second-data-transmission routes are maintained at the supply electric potential.

2. A dynamic barrel shifter according to claim 1, wherein each sense inverter in the input data outputting means comprises:

an N channel transistor for transmitting a zero electric potential from a source thereof to a drain in cases where a binary code set to the supply electric potential is transmitted to a gate thereof; and a P channel transistor, having a drain coupled to the drain of the N channel transistor, for transmitting the supply electric potential from a source thereof to the drain thereof in cases where a binary code set to a zero electric potential is transmitted to a gate thereof, the electric capacity of the P channel transistor being larger than that of the N channel transistor.

3. A dynamic barrel shifter according to claim 1, wherein each sense inverter in the shifted data output means comprises:

a plurality of N channel transistors connected with each other in series for transmitting a zero electric potential from a connected source thereof to a connected drain in cases where one binary code set to the supply electric potential is transmitted to gates thereof; and a P channel transistor having a drain coupled to the connected drain of the N channel transistors for transmitting the supply electric potential from a source thereof to the drain thereof in cases where a binary code set to a zero electric potential is transmitted to a gate thereof, the electric capacity of the P channel transistor being larger than that of the N channel transistors.

4. The dynamic barrel shifter recited in claim 1, wherein said N channel transistors present a back gate effect and said P channel transistors present no back gate effect.

* * * * *